(12) United States Patent
Chu et al.

(10) Patent No.: US 11,205,836 B2
(45) Date of Patent: Dec. 21, 2021

(54) BASE STATION ANTENNA AND ANTENNA ARRAY MODULE THEREOF

(71) Applicant: TONGYU COMMUNICATION INC., Guandong (CN)

(72) Inventors: Qingchen Chu, Zhongshan (CN); Mulin Liu, Zhongshan (CN); Zhonglin Wu, Zhongshan (CN); Wei Zhao, Zhongshan (CN); Wenlan Wang, Zhongshan (CN); Zhuofeng Gao, Zhongshan (CN); Lidong Zhang, Zhongshan (CN)

(73) Assignee: TONGYU COMMUNICATION INC., Zhongshan (CN)

( * ) Notice: Subject to any disclaimer, the term of this patent is extended or adjusted under 35 U.S.C. 154(b) by 148 days.

(21) Appl. No.: 16/500,158

(22) PCT Filed: Sep. 7, 2017

(86) PCT No.: PCT/CN2017/100843
§ 371 (c)(1),
(2) Date: Oct. 2, 2019

(87) PCT Pub. No.: WO2019/047091
PCT Pub. Date: Mar. 14, 2019

(65) Prior Publication Data
US 2020/0313285 A1    Oct. 1, 2020

(51) Int. Cl.
*H01Q 1/24*       (2006.01)
*H01Q 21/24*      (2006.01)
(Continued)

(52) U.S. Cl.
CPC ........... *H01Q 1/246* (2013.01); *H01Q 15/246* (2013.01); *H01Q 21/24* (2013.01); *H05K 1/0243* (2013.01)

(58) Field of Classification Search
CPC .. H01Q 1/246; H01Q 15/246; H01Q 21/0025; H01Q 21/0075; H01Q 21/24; H01Q 21/245; H05K 1/0243
See application file for complete search history.

(56) References Cited

U.S. PATENT DOCUMENTS 8,489,041 B2 *  7/2013  Teillet ................... H01Q 21/08
                                              455/114.3
2005/0168301 A1 *  8/2005  Carson ............... H01Q 21/0025
                                              333/117
(Continued)

FOREIGN PATENT DOCUMENTS

CN    101950846 A    1/2011
CN    203760661 U    8/2014
(Continued)

OTHER PUBLICATIONS

Apr. 27, 2018 Search Report issued in International Patent Application No. PCT/CN2017/100843.

*Primary Examiner* — Dimary S Lopez Cruz
*Assistant Examiner* — Patrick R Holecek
(74) *Attorney, Agent, or Firm* — Oliff PLC

(57) ABSTRACT

An antenna array module includes at least two antenna units mounted on a surface of a feed network circuit board with two power division circuits, and a filter mounted on a surface of the feed network circuit board with two coupling circuits. Each power division circuit includes an input end and a plurality of output ends. One power division circuit feeds an antenna unit for −45° polarization, and the other power division circuit feeds an antenna unit for +45° polarization. Each coupling circuit includes a radio frequency input end and an output end, and the output end of the coupling circuit is electrically connected to the input end of the power division circuit. The filter includes at least two output ends that are electrically connected to the radio (Continued)

frequency input end of the coupling circuit. A base station antenna includes a mounting structure and a connection structure.

19 Claims, 4 Drawing Sheets

(51) Int. Cl.
*H01Q 15/24* (2006.01)
*H05K 1/02* (2006.01)

(56) References Cited

U.S. PATENT DOCUMENTS

2006/0012526 A1  1/2006  Liang et al.
2015/0236421 A1  8/2015  Zemliakov

FOREIGN PATENT DOCUMENTS

| CN | 106252872 A | 12/2016 |
| CN | 106602280 A | 4/2017 |
| CN | 107706544 A | 2/2018 |

\* cited by examiner

BASE STATION ANTENNA AND ANTENNA ARRAY MODULE THEREOF

BACKGROUND

Technical Field

The present invention relates to the field of wireless communications technology, and in particular, to a base station antenna and an antenna array module thereof.

Related Art

A massive antenna array system (that is, Massive MIMO) is a core transmission technology for 5G in the future and is also an important link to achieve development of communications traffic volumes in depth and breadth. Currently, when major operators launch commercial 5G networks in next few years, equipment suppliers and related antenna suppliers are busily working on related pre-research work.

However, in the prior art, a large quantity of antenna units and all related radio frequency devices, such as filters and calibration network adapter plates are all integrally mounted and fixed, a complex mounting structure and a complex connection structure are provided, subsequent debugging and maintenance are not easily achieved, and as a result, manufacturing costs and use costs are high.

SUMMARY

In the present invention, to resolve the foregoing technical problem, an base station antenna and an antenna array module thereof are provided, to implement integration and modularization, improve expansibility, provide a simple mounting structure and a simple connection structure, easily achieve subsequent debugging and maintenance, and lower manufacturing costs and use costs.

To resolve the foregoing technical problem, the present invention provides an antenna array module, including: a feed network circuit board, a filter, and at least two antenna units, where one surface of the feed network circuit board is provided with two power division circuits, the other surface of the feed network circuit board is provided with two coupling circuits, the antenna units are mounted and fixed on the surface of the feed network circuit board provided with the power division circuits, and the filter is mounted and fixed on the surface of the feed network circuit board provided with the coupling circuits, to be integrated into an integrated structure; each power division circuit is provided with an input end and output ends whose quantity is not less than a quantity of the antenna units, each of a plurality of output ends of one power division circuit whose quantity is equal to a quantity of the antenna units feeds one antenna unit for −45° polarization, and each of a plurality of output ends of the other power division circuit whose quantity is equal to a quantity of the antenna units feeds one antenna unit for +45° polarization; each coupling circuit is provided with a radio frequency input end and an output end, and the output end of the coupling circuit is electrically connected to the input end of the power division circuit; and the filter is provided with at least two output ends to form at least two outputs, and each of the two output ends of the filter is electrically connected to the radio frequency input end of the coupling circuit.

Further, the feed network circuit board is a double-sided microstrip circuit board, the power division circuit is a microstrip power division circuit, and the coupling circuit is a microstrip coupling circuit.

Further, the input end of the power division circuit is electrically connected to the output end of the coupling circuit through a metalized via.

Further, the filter is a metal cavity filter, the filter includes a support plate for mounting and fixing the feed network circuit board, a metal cavity forming an integrated structure with the support plate, and a cover plate covering the metal cavity, a plurality of tuning nuts is mounted on the cover plate, and the periphery of the metal cavity is higher than the cover plate provided with the tuning nuts.

Further, the interior of the metal cavity is provided with two mounting cylindrical cavities penetrating the support plate, and the two output ends of the filter are respectively electrically connected to the radio frequency input ends of the coupling circuits through feed cores mounted in the mounting cylindrical cavities.

Further, a signal isolation cavity is formed between the support plate and the feed network circuit board.

Further, the filter is a dual-channel filter.

To resolve the foregoing technical problem, the present invention further provides a base station, including: at least two antenna array modules and a calibration network adapter plate, where the antenna array module includes a feed network circuit board, a filter, and at least two antenna units; one surface of the feed network circuit board is provided with two power division circuits, the other surface of the feed network circuit board is provided with two coupling circuits, the antenna units are mounted and fixed on the surface of the feed network circuit board provided with the power division circuits, and the filter is mounted and fixed on the surface of the feed network circuit board provided with the coupling circuits, to be integrated into an integrated structure; the antenna array modules are detachably mounted on the calibration network adapter plate by means of the filter; each power division circuit is provided with an input end and output ends whose quantity is not less than a quantity of the antenna units, each of a plurality of output ends of one power division circuit whose quantity is equal to a quantity of the antenna units feeds one antenna unit for −45° polarization, and each of a plurality of output ends of the other power division circuit whose quantity is equal to a quantity of the antenna units feeds one antenna unit for +45° polarization; each coupling circuit is provided with a radio frequency input end and an output end, the output end of the coupling circuit is electrically connected to the input end of the power division circuit, and the two coupling circuits are further provided with a common power division input end; the filter is provided with at least two radio frequency input ends and two output ends to form at least two inputs/outputs, and each of the two output ends of the filter is electrically connected to the radio frequency input end of the coupling circuit; and the calibration network adapter plate is provided with a radio frequency transit line including 2N radio frequency output ends and a calibration network line including N calibration output ends, where N≥1; in the calibration network adapter plate, each two of the radio frequency output ends are electrically connected to the two radio frequency input ends of the filter, and each calibration output end is electrically connected to the common power division input end of the coupling circuits.

Further, the calibration network adapter plate is a strip circuit board, the radio frequency transit line is a strip radio frequency transit line, and the calibration network line is a strip calibration network line.

Further, the feed network circuit board is a double-sided microstrip circuit board, the power division circuit is a microstrip power division circuit, and the coupling circuit is a microstrip coupling circuit.

Further, the input end of the power division circuit is electrically connected to the output end of the coupling circuit through a metalized via.

Further, the filter is a metal cavity filter, the filter includes a support plate for mounting and fixing the feed network circuit board, a metal cavity forming an integrated structure with the support plate, and a cover plate covering the metal cavity, a plurality of tuning nuts is mounted on the cover plate, and the periphery of the metal cavity is higher than the cover plate provided with the tuning nuts.

Further, the interior of the metal cavity is provided with two first mounting cylindrical cavities penetrating the support plate, and the two output ends of the filter are respectively electrically connected to the radio frequency input ends of the coupling circuits through feed cores mounted in the first mounting cylindrical cavities.

Further, an outer wall of the metal cavity is provided with a second mounting cylindrical cavity with two open ends, and in the calibration network adapter plate, the radio frequency output ends are electrically connected to the radio frequency input ends of the filter through a feed core mounted in the second mounting cylindrical cavity.

Further, the interior of the metal cavity is provided with a third mounting cylindrical cavity penetrating the cover plate, and in the calibration network adapter plate, each calibration output end is electrically connected to the common power division input end of the coupling circuits through a feed core mounted in the third mounting cylindrical cavity.

Further, a signal isolation cavity is formed between the support plate and the feed network circuit board.

Further, the filter is a dual-channel filter.

Further, the base station antenna further includes a bottom plate, and the calibration network adapter plate on which the antenna array modules are mounted and fixed is detachably mounted and fixed on the bottom plate.

Further, adjacent columns of antenna array modules are arranged in a staggered manner or in an aligned manner in a horizontal direction.

Further, the base station antenna is a massive MIMO base station antenna.

The base station antenna and the antenna array module thereof of the present invention have the following beneficial effects:

The antenna unit and the filter are designed in a modularized manner. On one hand, structure complexity and connection complexity are lowered; on the other hand, system integration can be greatly improved, material costs are lowered, massive automatic production is facilitated, a system weight is greatly reduced, and costs are greatly lowered. In addition, the modularized antenna and filter are more easily debugged and repaired, avoiding current whole-machine scrap of the antenna or filter caused by local quality problems. In addition, expansibility is strong, and a plurality of antenna array modules is arrayed for use according to requirements.

Secondly, the antenna unit and the filter in the module are connected by using a feed core, thereby reducing a large quantity of radio frequency connectors and greatly lowering costs, and reducing a weight.

Secondly, the antenna and the filter are separated from a calibration network and a radio frequency interface at a rear end, thereby effectively avoiding redesign of the antenna and the filter caused by inconsistent positions of radio frequency interfaces from different equipment suppliers. That is, the antenna and the filter have the same module structures, and only the calibration network adapter plate needs to be structurally designed according to interface requirements of different equipment suppliers, thereby effectively lowering development costs.

DETAILED DESCRIPTION

The present invention is described below in detail with reference to the accompanying drawings and implementations.

Figure 1:
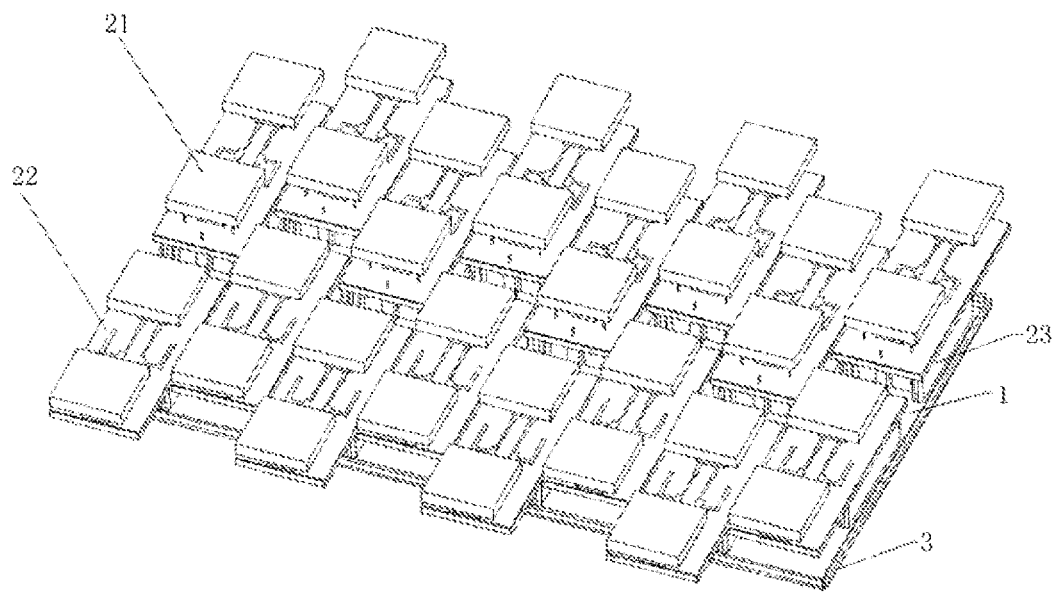
FIG. 1 is a schematic structural diagram of a base station antenna according to the present invention.
Figure 2:
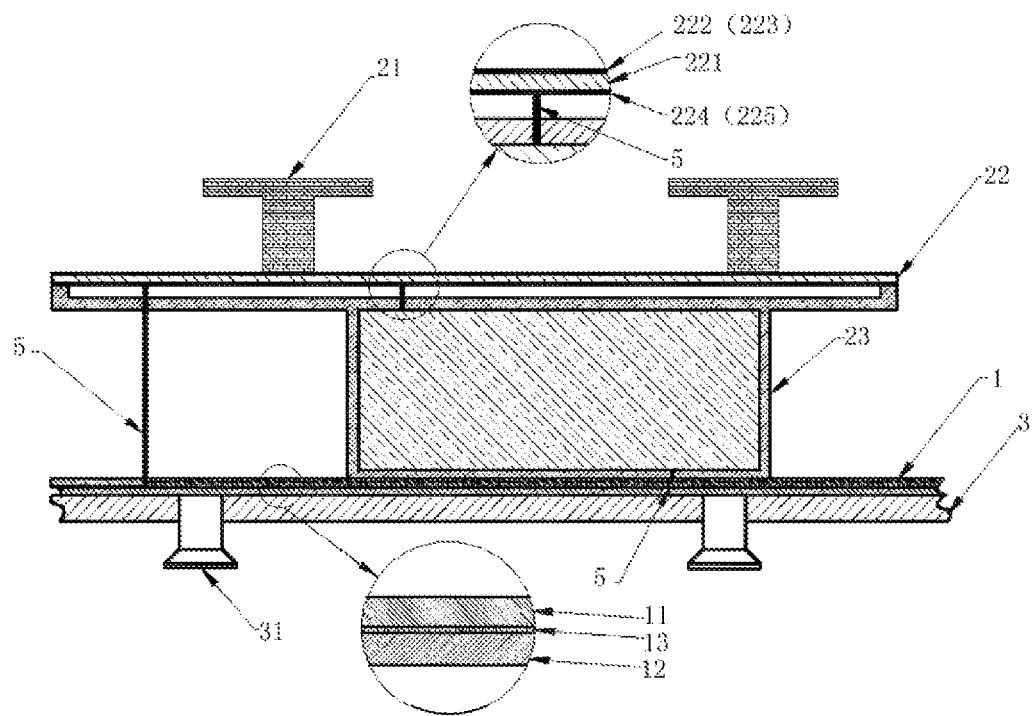
FIG. 2 is a schematic sectional structural diagram of a base station antenna according to the present invention.

Referring to FIG. 1 and FIG. 2, the present invention further provides a base station antenna. The base station antenna includes a calibration network adapter plate 1 and at least two antenna array modules 2 that are detachably mounted on the calibration network adapter plate 1 and that are electrically connected to the calibration network adapter plate 1.

Figure 3:
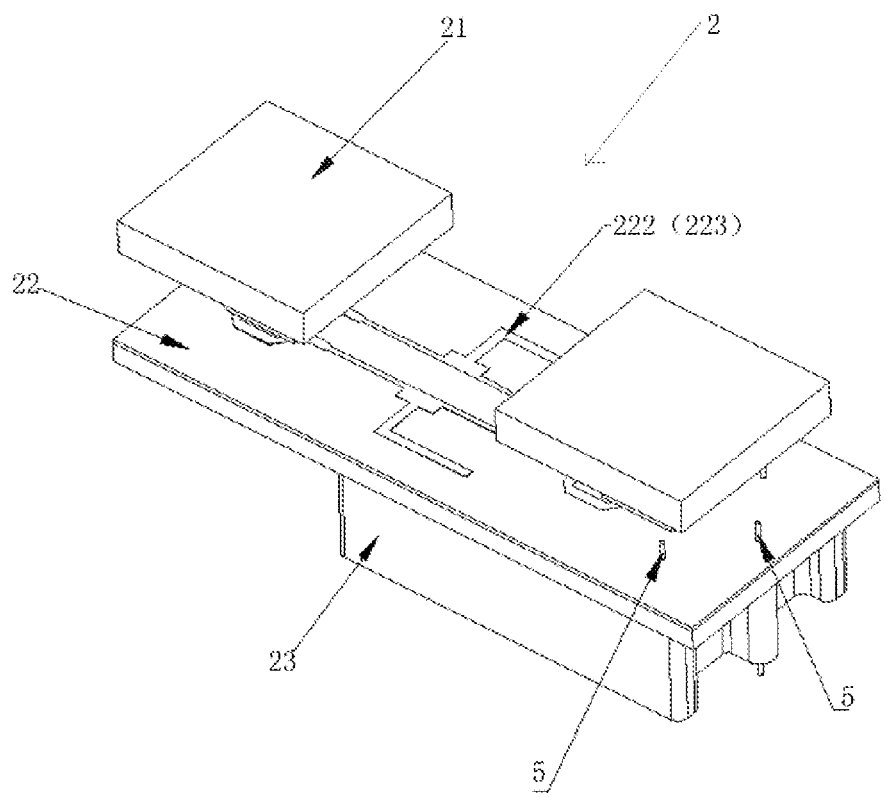
FIG. 3 is a schematic structural diagram of an antenna array module in the base station antenna shown in FIG. 1.

In a specific embodiment, specifically, as shown in FIG. 3, the antenna array module 2 includes a feed network circuit board 22, a filter 23, and at least two antenna units 21.

Figure 4:
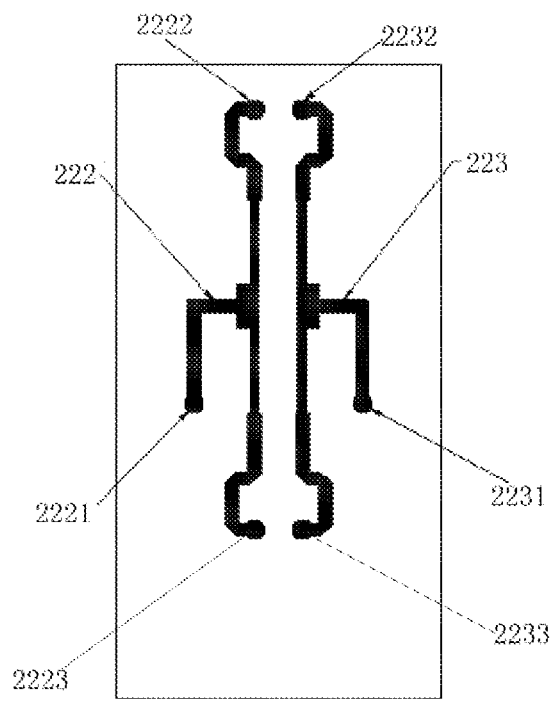
FIG. 4 is a schematic diagram of an upper-layer power division network on a feed network circuit board in the antenna array module shown in FIG. 3.
Figure 5:
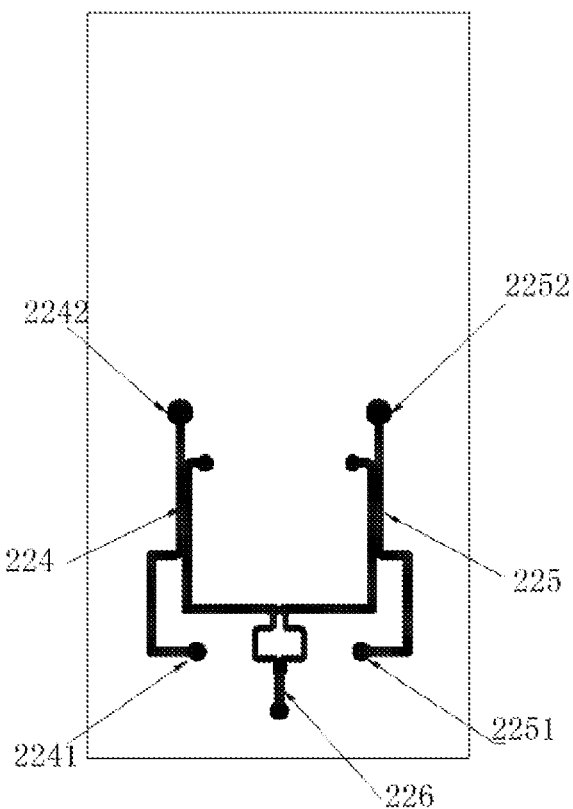
FIG. 5 is a schematic diagram of a lower-layer coupling network on a feed network circuit board in the antenna array module shown in FIG. 3.
Figure 6:
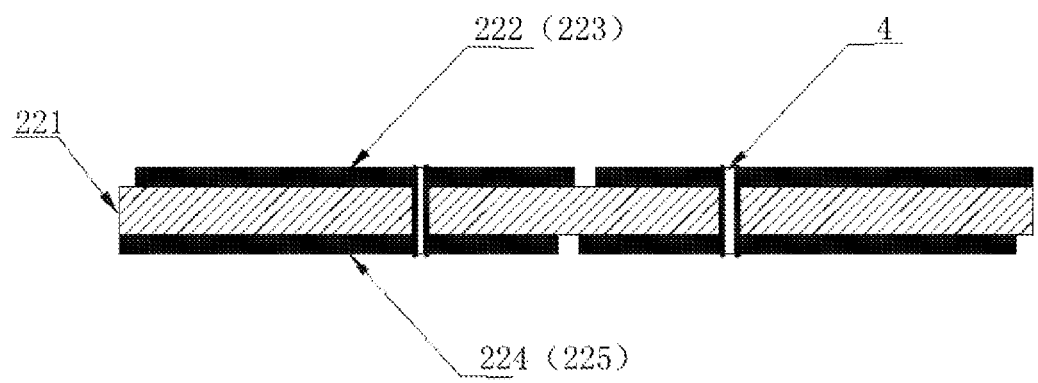
FIG. 6 is a schematic sectional structural diagram of a feed network circuit board in the antenna array module shown in FIG. 3.

Referring to FIG. 4 to FIG. 6, one surface of the feed network circuit board 22 is provided with two power division circuits 222 and 223, the other surface of the feed network circuit board 22 is provided with two coupling circuits 224 and 225. The antenna units 21 are mounted and fixed on the surface of the feed network circuit board 22 provided with the power division circuits 222 and 223, and the filter 23 is mounted and fixed on the surface of the feed network circuit board 22 provided with the coupling circuits 224 and 225, so that the feed network circuit board 22, the filter 23, and the at least two antenna units 21 may be integrated into an integrated structure. The antenna array modules 2 are detachably mounted on the calibration network adapter plate 1 by means of the filter 23.

Specifically, each power division circuit 222(223) is provided with an input end 2221(2231) and output ends whose quantity is not less than a quantity of the antenna units 21. Each of a plurality of output ends 2222 and 2223 of one power division circuit 222 whose quantity is equal to a quantity of the antenna units 21 feeds one antenna unit 21 for −45° polarization, and each of a plurality of output ends 2232 and 2233 of the other power division circuit 223 whose quantity is equal to a quantity of the antenna units 21 feeds one antenna unit 21 for +45° polarization. Preferably, a quantity of output ends of each power division circuit 222(223) is equal to a quantity of the antenna units 21. For example, when there are two antenna units 21, each power division circuit 222(223) is a one-to-two power division circuit, and two output ends may be provided. Alternatively, when there are three antenna units 21, each power division circuit 222(223) is a one-to-three power division circuit, and three output ends may be provided. Alternatively, when there are at least three antenna units 21, each power division circuit 222(223) may be formed by cascading a plurality of power division circuits. Each output end 2222, 2223 of one power division circuit 222 feeds one antenna unit 21 for −45° polarization, and each output end 2232, 2233 of the other power division circuit 223 feeds one antenna unit 21 for +45° polarization. For example, the antenna unit 21 may be usually a dual-polarized antenna unit, or may be certainly a single-polarized antenna unit.

Each coupling circuit 224(225) is provided with a radio frequency input end 2241(2251) and an output end 2242 (2252), and the output end 2242(2252) of the coupling circuit 224(225) is electrically connected to the input end 2221(2231) of the power division circuit 222(223). In addition, the two coupling circuits 224 and 225 are further provided with a common power division input end 226.

The filter 23 is provided with at least two radio frequency input ends and two output ends to form at least two outputs, and each of the two output ends of the filter 23 is electrically connected to the radio frequency input end 2241(2251) of the coupling circuit 224(225). Preferably, the filter 23 is a two-channel filter, has only two inputs/outputs, and can meet a use requirement of the antenna array modules 2.

The calibration network adapter plate 1 is provided with a radio frequency transit line including 2N radio frequency output ends and a calibration network line including N calibration output ends, where N≥1. In the calibration network adapter plate 1, each two of the radio frequency output ends are electrically connected to the two radio frequency input ends of the filter 23, and each calibration output end is electrically connected to the common power division input end 226 of the coupling circuits 224 and 225.

Preferably, the calibration network adapter plate 1 is a strip circuit board, the radio frequency transit line is a strip radio frequency transit line, and the calibration network line is a strip calibration network line. Specifically, the calibration network adapter plate 1 includes a first dielectric layer 11 and a second dielectric layer 12 that are provided in a stacked manner. A metal layer 13 (such as a copper layer) on which the radio frequency transit line and the calibration network line are disposed is disposed between the first dielectric layer 11 and the second dielectric layer 12.

Preferably, the feed network circuit board 22 is a double-sided microstrip circuit board, the power division circuit 222, 223 is a microstrip power division circuit, and the coupling circuit 224, 225 is a microstrip coupling circuit. Specifically, the feed network circuit board 22 includes an intermediate dielectric layer 221, and the power division circuits 222 and 223 and the coupling circuits 224 and 225 are respectively disposed on two surfaces of the intermediate dielectric layer 221. The feed network circuit board 22 in a microstrip form has good electrical performance, structure complexity of the feed network circuit board 22 can be reduced, and a volume and a weight of the feed network circuit board 22 can be reduced.

Preferably, the input end 2221(2231) of the power division circuit 222(223) is electrically connected to the output end 2242(2252) of the coupling circuit 224(225) through a metalized via 4. In this way, cable connection can be reduced, high reliability is provided, a weight is reduced, and costs are saved.

Figure 7:
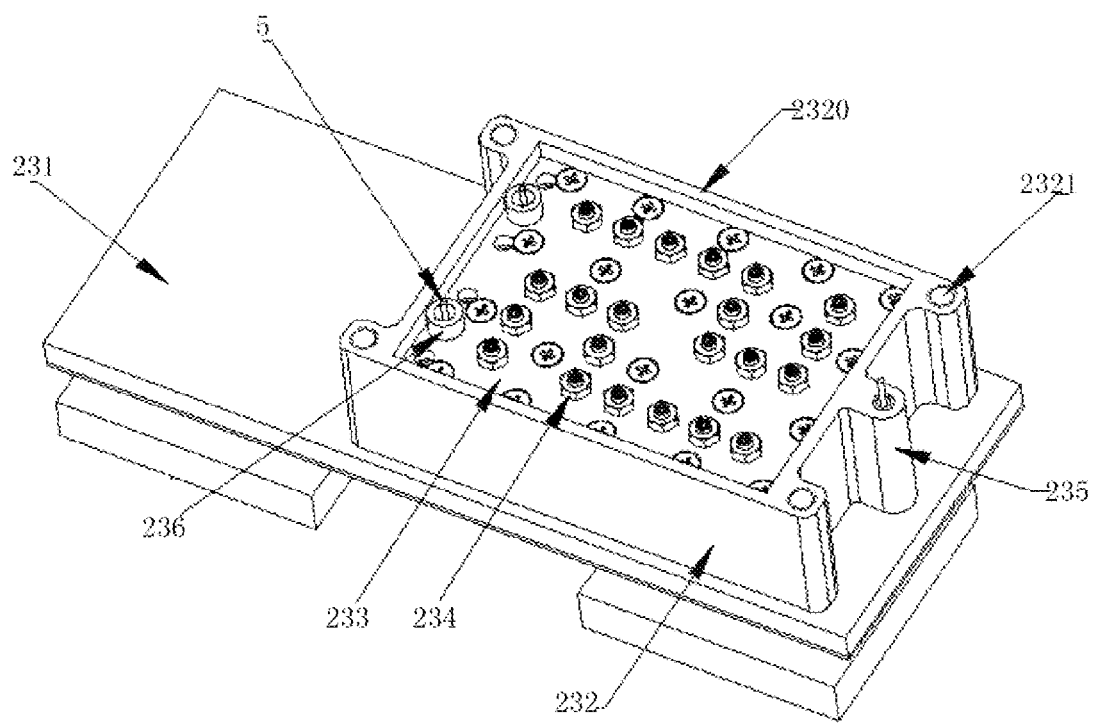
FIG. 7 is a schematic structural diagram of a filter in the antenna array module shown in FIG. 3.

In a preferred embodiment, as shown in FIG. 7, the filter 23 is a metal cavity filter. The filter 23 includes a support plate 231 for mounting and fixing the feed network circuit board 22, a metal cavity 232 forming an integrated structure with the support plate 231, and a cover plate 233 covering the metal cavity 232, a plurality of tuning nuts 234 is mounted on the cover plate 233. Preferably, the periphery 2320 of the metal cavity 232 is higher than the cover plate 233 provided with the tuning nuts 234, to avoid the tuning nuts 234 and the calibration network adapter plate 1 from interfering with each other.

Preferably, the interior of the metal cavity 232 is provided with two first mounting cylindrical cavities (not shown in the figure) penetrating the support plate 231, and the two output ends of the filter 23 are respectively electrically connected to the radio frequency input ends 2241(2251) of the coupling circuits 224(225) through feed cores 5 mounted in the first mounting cylindrical cavities.

Preferably, an outer wall of the metal cavity 232 is provided with a second mounting cylindrical cavity 235 with two open ends, and in the calibration network adapter plate 1, the radio frequency output ends are electrically connected to the radio frequency input ends of the filter 23 through a feed core 5 mounted in the second mounting cylindrical cavity 235.

Preferably, the interior of the metal cavity 232 is provided with a third mounting cylindrical cavity 236 penetrating the cover plate 233, and in the calibration network adapter plate 1, each calibration output end is electrically connected to the common power division input end 226 of the coupling circuits 224 and 225 through a feed core 5 mounted in the third mounting cylindrical cavity 236.

Figure 8:
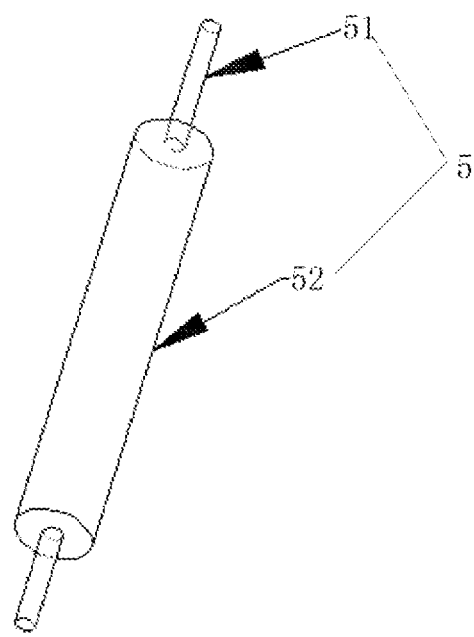
FIG. 8 is a schematic structural diagram of a feed core in the filter in FIG. 7.

Setting of the first mounting cylindrical cavity, the second mounting cylindrical cavity 235, and the third mounting cylindrical cavity 236 functions to shield electromagnetic interference of the feed cores 5. As shown in FIG. 8, the feed core 5 includes a metal core 51 and an insulating medium 52 wrapping the metal core 51, and the feed core 5 are exposed at two ends to be electrically connected to other components.

Preferably, a signal isolation cavity 230 is formed between the support plate 231 and the feed network circuit board 22, to prevent the filter 23 and the feed network circuit board 22 from electromagnetically interfering with each other.

In a specific embodiment, referring to FIG. 2 again, the base station antenna further includes a bottom plate 3, and the calibration network adapter plate on which the antenna array modules are mounted and fixed is detachably mounted and fixed on the bottom plate 3. The antenna array module 2 uses a plurality of bolt holes 2321, such as four bolt holes, disposed on the filter 23, specifically, on the metal cavity 232 of the filter 23 to be mounted and fixed together with the calibration network adapter plate 1 and the bottom plate 3 in a bolt fastening manner. The bottom of the bottom plate 3 is further provided with a support leg 31.

In a specific embodiment, when a plurality of antenna array modules 2 are mounted and fixed onto the calibration network adapter plate 1, adjacent columns of antenna array modules 2 are arranged in a staggered manner (as shown in FIG. 2) or in an aligned manner in a horizontal direction, so that the antenna units 21 disposed on the antenna array modules 2 correspondingly present a state of being arranged in a staggered manner or in an aligned manner. Specific arrangement manners may be set according to requirements of electrical performance.

In the foregoing embodiments, the radio frequency transit line in the calibration network adapter plate 1 further includes 2N radio frequency input ends, the calibration network line in the calibration network adapter plate 1 further includes a calibration input end. The radio frequency input end in the radio frequency transit line and the calibration input end in the calibration network line may both use a radio frequency connector such as an SMP, and each port position and connector type thereof are determined according to specification requirements of different devices.

In the foregoing embodiments, the base station antenna is especially preferably a massive MIMO base station antenna.

The present invention further provides the antenna array module according to any one of the foregoing embodiments. Details are not described herein again.

The base station antenna and the antenna array module thereof of the present invention have the following beneficial effects:

The antenna unit 21 and the filter 23 are designed in a modularized manner. On one hand, structure complexity and connection complexity are lowered; on the other hand, system integration can be greatly improved, material costs are lowered, massive automatic production is facilitated, a system weight is greatly reduced, and costs are greatly lowered. In addition, the modularized antenna and filter 23 are more easily debugged and repaired, avoiding current whole-machine scrap of the antenna or filter 23 caused by local quality problems. In addition, expansibility is strong, and a plurality of antenna array modules 2 is arrayed for use according to requirements.

Secondly, the antenna unit 21 and the filter 23 in the module are connected by using a feed core 5, thereby reducing a large quantity of radio frequency connectors and greatly lowering costs, and reducing a weight.

Secondly, the antenna 21 and the filter 23 are separated from a calibration network and a radio frequency interface at a rear end, thereby effectively avoiding redesign of the antenna and the filter 23 caused by inconsistent positions of radio frequency interfaces from different equipment suppliers. That is, the antenna and the filter 23 have the same module structures, and only the calibration network adapter plate 1 needs to be structurally designed according to interface requirements of different equipment suppliers, thereby effectively lowering development costs.

The foregoing descriptions are merely implementations of the present invention but are not intended to limit the patent scope of the present invention. Any equivalent modifications made to the structures or processes based on the content of the specification and the accompanying drawings of the present invention for direct or indirect use in other relevant technical fields shall also be encompassed in the patent protection scope of the present invention.

What is claimed is:

1. An antenna array module, comprising:
    a feed network circuit board;
    a filter; and
    at least two antenna units, wherein:
    one surface of the feed network circuit board is provided with two power division circuits, the other surface of the feed network circuit board is provided with two coupling circuits, the antenna units are mounted and fixed on the surface of the feed network circuit board provided with the power division circuits, and the filter is mounted and fixed on the surface of the feed network circuit board provided with the coupling circuits, to be integrated into an integrated structure;
    each power division circuit is provided with an input end and output ends whose quantity is not less than a quantity of the antenna units, each of a plurality of output ends of one power division circuit whose quantity is equal to a quantity of the antenna units feeds one antenna unit for −45° polarization, and each of a plurality of output ends of the other power division circuit whose quantity is equal to a quantity of the antenna units feeds one antenna unit for +45° polarization;
    each coupling circuit is provided with a radio frequency input end and an output end, and the output end of the coupling circuit is electrically connected to the input end of the power division circuit;
    the filter is provided with at least two output ends to form at least two outputs, and each of the two output ends of the filter is electrically connected to the radio frequency input end of the coupling circuit; and
    the filter is a metal cavity filter, the filter comprises a support plate for mounting and fixing the feed network circuit board, a metal cavity forming an integrated structure with the support plate, and a cover plate covering the metal cavity, a plurality of tuning nuts is mounted on the cover plate, and the periphery of the metal cavity is higher than the cover plate provided with the tuning nuts.

2. The antenna array module according to claim 1, wherein
    the feed network circuit board is a double-sided microstrip circuit board, the power division circuit is a microstrip power division circuit, and the coupling circuit is a micro strip coupling circuit.

3. The antenna array module according to claim 1, wherein
    the input end of the power division circuit is electrically connected to the output end of the coupling circuit through a metalized via.

4. The antenna array module according to claim 1, wherein
    the interior of the metal cavity is provided with two mounting cylindrical cavities penetrating the support plate, and the two output ends of the filter are respectively electrically connected to the radio frequency input ends of the coupling circuits through feed cores mounted in the mounting cylindrical cavities.

5. The antenna array module according to claim 1, wherein
    a signal isolation cavity is formed between the support plate and the feed network circuit board.

6. The antenna array module according to claim 1, wherein
    the filter is a dual-channel filter.

7. A base station antenna, comprising:
    at least two antenna array modules; and
    a calibration network adapter plate, wherein
    the antenna array module comprises a feed network circuit board, a filter, and at least two antenna units;
    one surface of the feed network circuit board is provided with two power division circuits, the other surface of the feed network circuit board is provided with two coupling circuits, the antenna units are mounted and fixed on the surface of the feed network circuit board provided with the power division circuits, and the filter is mounted and fixed on the surface of the feed network circuit board provided with the coupling circuits, to be integrated into an integrated structure;

the antenna array modules are detachably mounted on the calibration network adapter plate by means of the filter;

each power division circuit is provided with an input end and output ends whose quantity is not less than a quantity of the antenna units, each of a plurality of output ends of one power division circuit whose quantity is equal to a quantity of the antenna units feeds one antenna unit for −45° polarization, and each of a plurality of output ends of the other power division circuit whose quantity is equal to a quantity of the antenna units feeds one antenna unit for +45° polarization;

each coupling circuit is provided with a radio frequency input end and an output end, the output end of the coupling circuit is electrically connected to the input end of the power division circuit, and the two coupling circuits are further provided with a common power division input end;

the filter is provided with at least two radio frequency input ends and two output ends to form at least two inputs/outputs, and each of the two output ends of the filter is electrically connected to the radio frequency input end of the coupling circuit; and the calibration network adapter plate is provided with a radio frequency transit line comprising 2N radio frequency output ends and a calibration network line comprising N calibration output ends, wherein N≥1; in the calibration network adapter plate, each two of the radio frequency output ends are electrically connected to the two radio frequency input ends of the filter, and each calibration output end is electrically connected to the common power division input end of the coupling circuits.

8. The base station antenna according to claim 7, wherein the calibration network adapter plate is a strip circuit board, the radio frequency transit line is a strip radio frequency transit line, and the calibration network line is a strip calibration network line.

9. The base station antenna according to claim 7, wherein the feed network circuit board is a double-sided microstrip circuit board, the power division circuit is a microstrip power division circuit, and the coupling circuit is a micro strip coupling circuit.

10. The base station antenna according to claim 7, wherein
the input end of the power division circuit is electrically connected to the output end of the coupling circuit through a metalized via.

11. The base station antenna according to claim 7, wherein
the filter is a metal cavity filter, the filter comprises a support plate for mounting and fixing the feed network circuit board, a metal cavity forming an integrated structure with the support plate, and a cover plate covering the metal cavity, a plurality of tuning nuts is mounted on the cover plate, and the periphery of the metal cavity is higher than the cover plate provided with the tuning nuts.

12. The base station antenna according to claim 11, wherein
the interior of the metal cavity is provided with two first mounting cylindrical cavities penetrating the support plate, and the two output ends of the filter are respectively electrically connected to the radio frequency input ends of the coupling circuits through feed cores mounted in the first mounting cylindrical cavities.

13. The base station antenna according to claim 11, wherein
an outer wall of the metal cavity is provided with a second mounting cylindrical cavity with two open ends, and in the calibration network adapter plate, the radio frequency output ends are electrically connected to the radio frequency input ends of the filter through a feed core mounted in the second mounting cylindrical cavity.

14. The base station antenna according to claim 11, wherein
the interior of the metal cavity is provided with a third mounting cylindrical cavity penetrating the cover plate, and in the calibration network adapter plate, each calibration output end is electrically connected to the common power division input end of the coupling circuits through a feed core mounted in the third mounting cylindrical cavity.

15. The base station antenna according to claim 11, wherein
a signal isolation cavity is formed between the support plate and the feed network circuit board.

16. The base station antenna according to claim 7, wherein
the filter is a dual-channel filter.

17. The base station antenna according to claim 7, further comprising:
a bottom plate, wherein
the calibration network adapter plate on which the antenna array modules are mounted and fixed is detachably mounted and fixed on the bottom plate.

18. The base station antenna according to claim 7, wherein
adjacent columns of antenna array modules are arranged in a staggered manner or in an aligned manner in a horizontal direction.

19. The base station antenna according to claim 7, wherein
the base station antenna is a massive MIMO base station antenna.

* * * * *